United States Patent
Jeong

(10) Patent No.: US 6,579,789 B2
(45) Date of Patent: Jun. 17, 2003

(54) METHOD FOR FABRICATING METAL WIRING AND THE METAL WIRING

(75) Inventor: Cheol Mo Jeong, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 09/880,055

(22) Filed: Jun. 14, 2001

(65) Prior Publication Data

US 2002/0000661 A1 Jan. 3, 2002

(30) Foreign Application Priority Data

Jun. 30, 2000 (KR) .......................... 2000-37122

(51) Int. Cl.⁷ ............... H01L 21/4763; H01L 21/44; H01L 21/302; H01L 21/461
(52) U.S. Cl. ............... 438/627; 438/628; 438/653; 438/654; 438/687
(58) Field of Search .................. 438/687, 627, 438/653, 654, 628, 629, 637–639, 927, 656

(56) References Cited

U.S. PATENT DOCUMENTS

| | | | | |
|---|---|---|---|---|
| 5,990,008 A | * | 11/1999 | Koyama et al. | 438/629 |
| 6,071,552 A | * | 6/2000 | Ku | 427/124 |
| 6,143,646 A | * | 11/2000 | Wetzel | 438/175 |
| 6,346,741 B1 | * | 2/2002 | Van Buskirk et al. | 257/664 |

FOREIGN PATENT DOCUMENTS

| | | | | |
|---|---|---|---|---|
| JP | 11-40515 | * | 2/1999 | H01L/21/28 |

* cited by examiner

*Primary Examiner*—Shouxiang Hu
(74) *Attorney, Agent, or Firm*—Birch, Stewart, Kolasch & Birch, LLP

(57) ABSTRACT

In the method for fabricating a metal wiring, an insulation film is formed on a semiconductor substrate. The insulation film has a contact hole exposing the semiconductor substrate. A Ti—Si film is formed over the silicon substrate, and a Ti—Si—N film is formed on the Ti—Si film. The contact hole is then filled by depositing copper on the Ti—Si—N film, and a silicon nitride film is formed over the silicon substrate.

14 Claims, 3 Drawing Sheets

METHOD FOR FABRICATING METAL WIRING AND THE METAL WIRING

BACKGROUND OF THE INVENTION

1. Field of the Invention

The present invention relates to a method for fabricating metal wiring and the metal wiring.

2. Description of the Related Art

As the integration degree of semiconductor devices is increased, the dual damascene process has become widely used as a method for fabricating metal wiring because it can improve device properties and fill up a via for the least cost. And, the damascene process can be widely applied to a logic device and memory device of less than 13 $\mu$m.

Recently, a method for depositing copper by chemical vapor deposition (hereinafter, referred to CVD) has been studied as a method for fabricating the metal wiring by the damascene process. Copper thin film formed by CVD is used because it is relatively easy to provide for step coverage as the design rule of semiconductor devices is gradually narrowed.

Accordingly, it is necessary to apply a diffusion prevention film corresponding to the deposition of copper in the conventional damascene process. TiN and TaN have been widely used as the diffusion prevention film.

However, the conventional diffusion prevention film using TiN and TaN has a problem when manufacturing a semiconductor device having a contact size less than 0.2 $\mu$m×0.2 $\mu$m.

Firstly, in case of a diffusion prevention film of copper using TiN,

A. A first type of metal contact (non-via):

1. The process is complicated because it requires a pre-cleaning process by Ion Metal Plasma (hereinafter, referred to IMP), a CVD process using Ti, and an annealing process.

2. When the contact size is small, it is difficult to fill with copper because an overhang is generated due to the thickness of the Ti/TiN.

3. The substrate may be damaged by the RF Ar process in the IMP process using Ti or CVD using TiN.

B. A second type of metal contact (via)

1. The process is complicated because it requires an RF cleaning process by IMP, a CVD process using Ti, and an annealing process using TiN.

2. When the contact size is small, it is difficult to fill with copper because an overhang is generated due to the thickness of T/TiN.

Secondly, in case of using TaN as the diffusion prevention film,

A. A first metal contact (non-via):

1. The process is complicated because it requires a pre-cleaning process by IMP, a CVD process using Ta, and an annealing process using TaN.

2. When the contact size is small, it is difficult to fill with copper because an the overhang is generated due to the thickness of Ti/TiN.

3. The material cost of Ta used in the CVD process is high.

4. It is difficult to obtain a metal contact resistance.

B. A second type of metal contact (via):

1. The process is complicated because it requires an RF cleaning process by IMP, a CVD process using Ta, and an annealing process using TaN.

2. When the contact size is small, it is difficult to fill with copper because an overhang is generated due to the thickness of Ti/TiN.

SUMMARY OF THE INVENTION

Therefore, an object of the present invention is to provide method of fabricating metal wiring and the metal wiring that decrease manufacturing costs and improve device properties by reducing the number of process steps. In an embodiment of the present invention the previous four processing steps necessary for forming a diffusion prevention film reduce to one step using a Ti—Si—N film as a diffusion prevention film.

To achieve the object, a method for fabricating a metal wiring, comprises the steps of: forming an insulation film on a semiconductor substrate, the insulation film having a contact hole exposing the semiconductor substrate; forming a Ti—Si film over the silicon substrate; forming a Ti—Si—N film on the Ti—Si film; filling up the contact hole by depositing copper on the Ti—Si—N film; and forming a silicon nitride film over the silicon substrate.

These and other objects are achieved by providing a metal wiring structure, comprising: an insulation film formed on a semiconductor substrate, the insulation film defining a contact hole exposing a portion of the semiconductor substrate; a Ti—Si film formed on the exposed portion of the semiconductor substrate and sidewalls of the contact hole; a Ti—Si—N film formed on the Ti—Si film; copper formed on the Ti—Si—N film in the contact hole, the copper filling the contact hole; and a silicon nitride layer formed over the semiconductor substrate.

The above objects, and other features and advantages of the present invention will become more apparent in light of the following detailed description and the accompanying figures.

DETAILED DESCRIPTION OF THE INVENTION

Figure 1A:
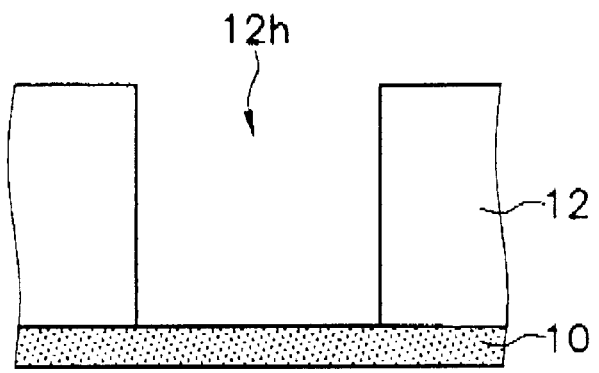
FIGS. 1A to 1D are cross-sectional views to explain a method for fabricating metal wiring in accordance with an embodiment of the present invention.

The preferred embodiment of the present invention is described in detail referring to the drawings. In the drawings, elements having the same function are described by the same reference numeral. No repeated description for the same elements will be made.

FIGS. 1A to 1D are cross-sectional views to explain the method of fabricating metal wiring in accordance with the present invention.

Referring to FIG. 1A, an oxide film 12 is deposited over a silicon substrate and then a metal contact hole 12h and a metal line pattern are formed in accordance with a damascene process.

Thereafter, a cleaning process is performed in a Ti chamber for CVD processing to obtain a more desirable contact resistance. Here, the cleaning process removes the composition of an oxide film and carbon using $SiH_4+H_2$ gas, and the process is performed in a in-situ fashion.

Figure 1B:
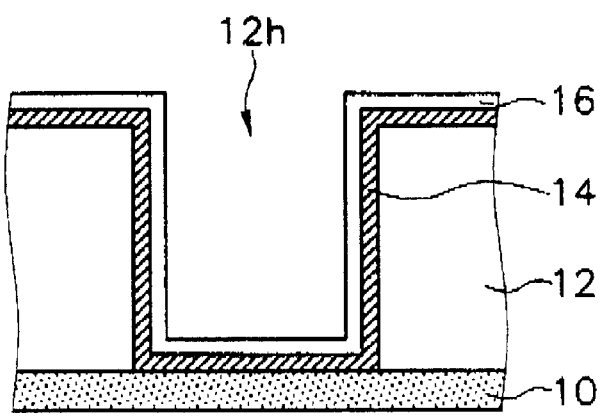

Referring to FIG. 1B, a Ti—Si film 14 is formed on the insulation film 12 having the contact hole 12h using $SiH_4$ and $TiCl_4$ gas in the same chamber. The Ti—Si film 14 increases the contact resistance and an adhesiveness of the boundary of oxide film and metal after the cleaning process. Here, $C54\text{-}TiSi_2$ phase is formed by simultaneously injecting $SiH_4$ and $TiCl_4$ gas during the deposition of the Ti—Si film 14. And, the Ti—Si film 14 is deposited to a thickness of 30 to 200 Å depending on the junction depth and the contact size.

$C54\text{-}TiSi_2$ phase may be also formed on the silicon substrate 10 exposed by the contact hole 12h by injecting $TiCl_4$ gas without $SiH_4$ and making the $TiCl_4$ gas respond to the silicon substrate 10 during the deposition of the Ti—Si film 14.

After the Ti—Si film 14 is deposited, a Ti—Si—N film 16 is formed in-situ to prevent diffusion of copper.

The Ti—Si—N film 16 is formed on the Ti—Si film by adding $N_2$ gas during the formation of the Ti—Si film 14. Here, the specific resistance of the Ti—Si—N film 16 is maintained less than 1000 $\mu\Omega$ per unit area, and the stress is maintained at −1000 to +1000 MPa by controlling a flow rate of the $N_2$ gas. The Ti—Si—N film 16 is deposited to the thickness of 30~200 Å.

Figure 1C:
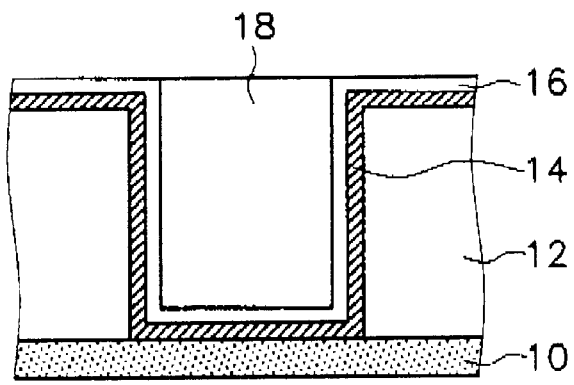
Figure 1D:
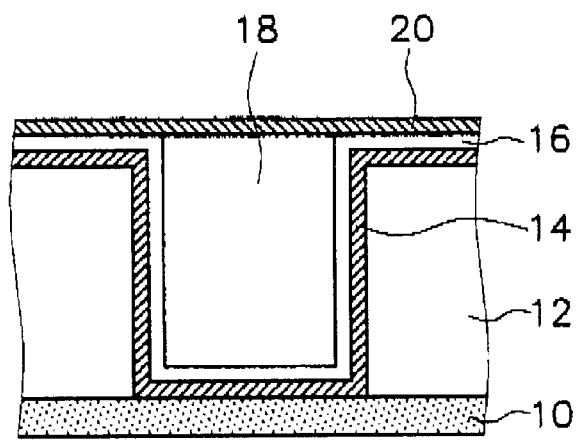

Referring to FIG. 1C, copper is deposited over the Ti—Si—N film 16 to fill up the contact hole 12h. Then the resulting structure is planarized according to a CMP process using the Ti—Si—N film as a polish stop layer to form the copper layer 18 planar with the Ti—Si—N layer 16 over the oxide film 14. Thereafter, a silicon nitride film 20 is deposited over the silicon substrate 10. As a result, the metal wiring in accordance with the present invention is obtained.

Figure 2A:
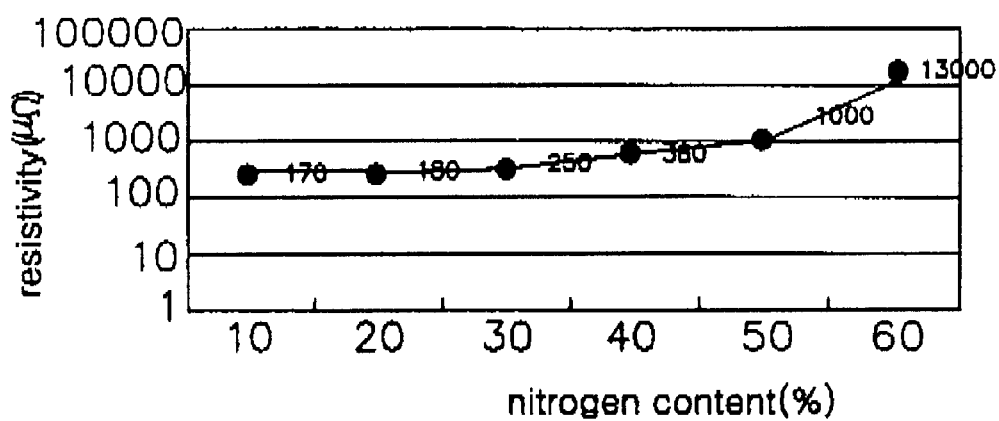
FIG. 2A is a drawing to show the specific resistance according to the content rate of nitrogen in a diffusion protection film Ti—Si—N.

FIG. 2A is a graph to show a specific resistance according to the quantity of nitrogen in the diffusion prevention film Ti—Si—N 16. And, FIG. 2B is a graph to show the stress according to the quantity of nitrogen in the diffusion prevention film Ti—Si—N 16.

As shown in FIG. 2A, the specific resistance of the Ti—Si—N film 16 can be maintained less than 300$\mu\Omega$ by controlling the quantity of $N_2$ gas added during the deposition of the Ti—Si film 14. And, the metal resistance may be obtained according to the variation of the constitution rate of Si and Ti.

Figure 2B:
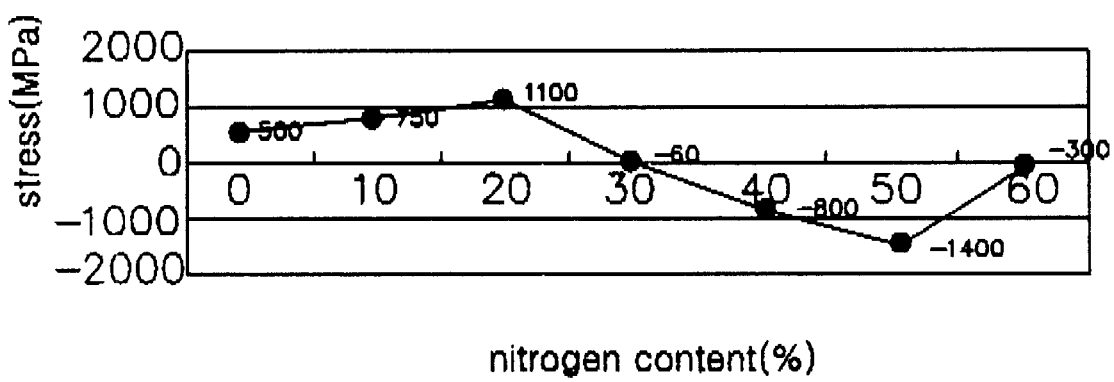
FIG. 2B is a drawing to show the stress according to the content rate of nitrogen in a diffusion protection film Ti—Si—N.

As shown in FIG. 2B, the stress of the Ti—Si—N film 16 can be maintained less than 0 by controlling quantity of $N_2$ gas.

As described above, in accordance with present invention, an improved metal wiring is obtained by simplifying the process to fill a via or contact hole, having a small design rule, with copper, and by making an in-situ process possible. Moreover, the conventional four process steps have been reduced to one, and a process performed in three process devices can be performed in one chamber of one device. As a result, the method of the present invention decreases manufacturing costs and increases the return rate of a device.

The invention may be embodied in other specific forms without departing from the spirit or essential characteristics thereof. The present embodiment is to be considered in all respects as illustrative and not restrictive. And all changes which come within the meaning and range of equivalency of the claims are thereof intended to be embraced therein.

What is claimed is:

1. A method for fabricating a metal wiring, comprising the steps of:
    forming an insulation film on a semiconductor substrate, the insulation film having a contact hole exposing the semiconductor substrate;
    forming a Ti—Si film over the semiconductor substrate and the insulation film;
    forming a Ti—Si—N film on the Ti—Si film;
    filling up the contact hole by depositing copper on the Ti—Si—N film; and
    removing a portion of the copper so that a top surface of the copper in the contact hole and a top surface of the Ti-Si-N film over the insulation film are coplanar, wherein the removing step is performed using a chemical-mechanical polishing (OMP) process with the Ti—Si—N film as a polish stop layer.

2. The method according to claim 1, wherein the forming an insulation film step comprises:
    forming the insulation film on the semiconductor substrate; and
    patterning the insulation film to form the contact hole.

3. The method according to claim 1, further comprising:
    cleaning the exposed semiconductor substrate prior to forming the Ti-Si film.

4. The method according to claim 3, wherein the cleaning process is to remove a composition of an oxide film and carbon using $SiH_4+H_2$ gas.

5. The method according to claim 3, wherein the cleaning process is performed in an in-situ fashion.

6. The method according to claim 1, wherein the Ti-Si film is formed using $SiH_4$ and $TiCl_4$ gases in a Ti chamber for CVD processing.

7. The method according to claim 6, wherein a stress of the Ti—Si—N film is maintained at −1000~+1000 MPa by controlling a quantity of the $N_2$ gas.

8. The method according to claim 1, wherein the forming a Ti-Si film step forms $C54\text{-}TiSi_2$ phase by simultaneously injecting $SiH_4$ and $TiCl_4$ gases during the deposition of the Ti-Si film.

9. The method according to claim 1, wherein the forming a Ti-Si film step forms $C54\text{-}TiSi_2$ phase on the exposed semiconductor substrate by injecting $TiCl_4$ gas without SiH4 during the deposition of the Ti—Si film.

10. The method according to claim 1, wherein a thickness of the Ti—Si film is about 30~200 Å.

11. The method according to claim 1, wherein the forming a Ti-Si-N film step forms the Ti—Si—N film by adding $N_2$ gas immediately after the formation of the Ti—Si film.

12. The method according to claim 11, wherein a sheet resistance of the Ti—Si—N film is maintained less than 1000 $\mu\Omega$/■ by controlling a quantity of the $N_2$ gas.

13. The method according to the claim 1, wherein a thickness of the Ti—Si—N film is about 30~200 Å.

14. The method according to claim 1, wherein the semiconductor substrate is a silicon substrate.

* * * * *